United States Patent
Dory et al.

(10) Patent No.: US 7,637,008 B2
(45) Date of Patent: Dec. 29, 2009

(54) METHODS FOR MANUFACTURING IMPRINTED SUBSTRATES

(75) Inventors: Thomas S. Dory, Gilbert, AZ (US); Michael Walk, Mesa, AZ (US); Robert L. Sankman, Phoenix, AZ (US); Boyd L. Coomer, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 484 days.

(21) Appl. No.: 10/323,165

(22) Filed: Dec. 18, 2002

(65) Prior Publication Data

US 2004/0118594 A1 Jun. 24, 2004

(51) Int. Cl.
  *H01R 3/10* (2006.01)
(52) U.S. Cl. ............... 29/852; 29/830; 29/831; 29/846; 174/262
(58) Field of Classification Search ........... 29/825, 29/829–832, 846–849, 852; 174/250, 255, 174/257, 262; 361/748; 205/125, 40
See application file for complete search history.

(56) References Cited

U.S. PATENT DOCUMENTS

| | | | | |
|---|---|---|---|---|
| 2,912,748 A | * | 11/1959 | Gray .................... | 29/849 |
| 2,986,804 A | * | 6/1961 | Greenman et al. ......... | 29/852 |
| 3,438,127 A | * | 4/1969 | Lehtonen .............. | 29/848 |
| 3,628,243 A | * | 12/1971 | Phol et al. ............. | 29/849 |
| 4,049,903 A | | 9/1977 | Kobler | |
| 4,584,767 A | | 4/1986 | Gregory | |
| 4,651,417 A | | 3/1987 | Schumacher, III et al. ... | 29/848 |
| 4,704,791 A | | 11/1987 | Chellis et al. | |
| 4,912,844 A | | 4/1990 | Parker ................. | 29/848 |
| 4,941,255 A | | 7/1990 | Bull | |
| 5,043,184 A | | 8/1991 | Fujii et al. ............ | 427/96 |
| 5,048,178 A | | 9/1991 | Bindra et al. | |
| 5,091,339 A | | 2/1992 | Carey ................. | 216/18 |
| 5,259,110 A | * | 11/1993 | Bross et al. ............ | 29/830 |
| 5,528,001 A | * | 6/1996 | Roberts ............... | 174/268 |

(Continued)

FOREIGN PATENT DOCUMENTS

CN 1279251 1/2001

(Continued)

OTHER PUBLICATIONS

"Method to Control the Geometry and Vertical Profile of Via Holes in Substrate Materials", *IBM Technical Disclosure Bulletin*, 35, (Oct. 1, 1992), 211-216.

(Continued)

*Primary Examiner*—Donghai D. Nguyen
(74) *Attorney, Agent, or Firm*—Schwegman, Lundberg & Woessner, P.A.

(57) ABSTRACT

A package includes at least one electronic component mounted on an imprinted substrate. In an embodiment, the substrate may comprise conductive traces, vias, and patterns of lands on one or more layers. Such features may be formed by imprinting in one operation rather than sequentially. Conductor features, such as trenches, holes, and planes, may be formed of different sizes simultaneously. One or more vias may be formed in one or more trenches. Methods of fabricating an imprinted substrate, as well as application of the imprinted package to an electronic assembly, are also described.

21 Claims, 7 Drawing Sheets

U.S. PATENT DOCUMENTS

| | | | | |
|---|---|---|---|---|
| 5,830,563 | A | 11/1998 | Shimoto et al. | 428/209 |
| 5,928,767 | A | 7/1999 | Gebhardt et al. | |
| 6,005,198 | A | 12/1999 | Gregoire | 174/262 |
| 6,127,196 | A | 10/2000 | Butera et al. | 438/15 |
| 6,156,221 | A | 12/2000 | Lauffer et al. | |
| 6,156,870 | A | 12/2000 | Morita et al. | 528/353 |
| 6,254,972 | B1 | 7/2001 | Farquhar et al. | 428/209 |
| 6,783,652 | B2 * | 8/2004 | Iijima et al. | 205/125 |
| 6,815,709 | B2 * | 11/2004 | Clothier et al. | 257/40 |
| 6,930,256 | B1 * | 8/2005 | Huemoeller et al. | 174/260 |
| 7,371,975 | B2 | 5/2008 | Dory et al. | |
| 2003/0135998 | A1 | 7/2003 | Walz et al. | 29/854 |
| 2004/0124533 | A1 | 7/2004 | Keser et al. | |
| 2008/0000674 | A1 | 1/2008 | Dory et al. | |

FOREIGN PATENT DOCUMENTS

| | | | |
|---|---|---|---|
| GB | 2212332 | | 7/1989 |
| JP | 11-186698 | | 7/1999 |
| JP | 2000-124581 | * | 4/2000 |
| WO | WO-01/50825 A1 | | 7/2001 |

OTHER PUBLICATIONS

Tormen, M., et al., "Thermocurable Polymers as Resists for Imprint Lithography", *Electronics Letters*, 36, (May 25, 2000), 983-984.

"U.S. Appl. No. 10/322,902 Final Office Action mailed Nov. 22, 2005", 11 pgs.

"U.S. Appl. No. 10/322,902 Non-Final Office Action mailed Mar. 25, 2005", 13 pgs.

"U.S. Appl. No. 10/322,902 Non-Final Office Action mailed Jun. 28, 2006", 16 pgs.

"U.S. Appl. No. 10/322,902 Notice of Allowance mailed Jun. 11, 2007", 9 pgs.

"U.S. Appl. No. 10/322,902 Response filed Apr. 24, 2006 in response to Final Office Action mailed Nov. 22, 2005", 9 pgs.

"U.S. Appl. No. 10/322,902 Response filed Sep. 26, 2005 filed in response to Non-Final Office Action mailed Mar. 25, 2005", 13 pgs.

"U.S. Appl. No. 10/322,902 Response filed Nov. 28, 2006 in response to Non-Final Office Action mailed Jun. 28, 2006", 10 pgs.

"U.S. Appl. No. 10/335,187 Final Office Action mailed Mar. 9, 2005", 9 pgs.

"U.S. Appl. No. 10/335,187 Non-Final Office Action mailed Sep. 15, 2004", 9 pgs.

"U.S. Appl. No. 10/335,187 Response filed Jan. 17, 2006 in response to Non-Final Office Action mailed Sep. 15, 2005", 14 pgs.

"U.S. Appl. No. 10/335,187 Response filed Jun. 9, 2005 in response to Final Office Action mailed Mar. 9, 2005", 14 pgs.

"U.S. Appl. No. 10/335,187 Final Office Action mailed Feb. 3, 2004", 9 pgs.

"U.S. Appl. No. 10/335,187 Final Office Action mailed Mar. 23, 2006", 9 pgs.

"U.S. Appl. No. 10/335,187 Non-Final Office Action mailed Sep. 15, 2005", 8 pgs.

"U.S. Appl. No. 10/335,187 Non-Final Office Action mailed Sep. 16, 2003", 7 pgs.

"U.S. Appl. No. 10/335,187 Response filed May 3, 2004 in response to Final Office Action mailed Feb. 3, 2004", 12 pgs.

"U.S. Appl. No. 10/335,187 Response filed Nov. 17, 2003 in response to Non-Final Office Action mailed Sep. 16, 2003", 12 pgs.

"U.S. Appl. No. 10/335,187 Response filed Dec. 15, 2004 in response to Non-Final Office Action mailed Sep. 15, 2004", 18 pgs.

"U.S. Appl. No. 10/322,902, Non-Final Office Action Mailed Nov. 26, 2007", 19 pgs.

"U.S. Appl. No. 10/322,902 Amendment Under 37 CFR 1.312 filed Jan. 21, 2008", 7 pgs.

"U.S. Appl. No. 10/322,902, Notice of Allowance Mailed Jan. 8, 2008", 9 pgs.

"U.S. Appl. No. 10/322,902, Response filed Jan. 17, 2005 to Restriction Requirement mailed Dec. 15, 2004", 9 pgs.

"U.S. Appl. No. 10/322,902, Restriction Requirement Received mailed Dec. 15, 2004", 5 pgs.

"U.S. Appl. No. 10/335,187 Response filed Jun. 27, 2008 to Non-Final Office Action mailed Mar. 27, 2008", 13 pgs.

"U.S. Appl. No. 10/335,187, Appeal Brief filed Sep. 21, 2006", 18 pgs.

"U.S. Appl. No. 10/335,187, Non-Final Office Action mailed Mar. 27, 2008.", 7 pgs.

"U.S. Appl. No. 10/335,187, Reply Brief filed Jun. 13, 2006", 5 pgs.

"U.S. Appl. No. 10/335,187 Final Office Action mailed Oct. 8, 2008", 9pgs.

"U.S. Appl. No. 11/853,856, Response filed Apr. 7, 2009 to Non Final Office Action mailed Feb. 6, 2009", 13 pgs.

"U.S. Appl. No. 11/853,856 Non-Final Office Action mailed Feb. 6, 2009", 12 pgs.

* cited by examiner

501 —
FORM A SUBSTRATE TO MOUNT AN ELECTRONIC COMPONENT

- THE SUBSTRATE MAY BE FORMED OF MATERIAL SELECTED FROM THE GROUP COMPRISING BISMALEIMIDE RESINS (E.G. BISMALEIMIDE TRIAZENE), EPOXY, LIQUID CRYSTAL POLYMER, POLYCARBONATE, POLYESTER, POLYETHER, AND POLYIMIDE

- THE SUBSTRATE MAY BE FORMED OF A POLYMER (E.G. POLYIMIDE OR EPOXY) FILLED WITH PARTICLES (E.G. SILICA, ALUMINA, OR FIBERGLASS).

502 —
IMPRINT SIMULTANEOUSLY A PLURALITY OF CONDUCTOR FEATURES IN THE SUBSTRATE

- THE CONDUCTOR FEATURES INCLUDE ONE OR MORE VIAS AND TRENCHES, OPTIONALLY HAVING DIFFERENT GEOMETRIES

- E.G., THE VIAS AND TRENCHES MAY HAVE DIFFERENT DEPTHS, WIDTHS, LENGTHS, THICKNESSES, ETC.

- VIAS MAY BE FORMED WITHIN TRENCHES

- VIAS NEED NOT BE FORMED WITHIN A VIA PAD

503 —
FILL THE CONDUCTOR FEATURES WITH AN ELECTRICALLY CONDUCTIVE MATERIAL

FORM A SUBSTRATE TO MOUNT AN ELECTRONIC COMPONENT

- FORM AT LEAST TWO LAYERS, EACH TO INCLUDE A PLURALITY OF CONDUCTOR FEATURES IN A CONDUCTOR REGION

- E.G., FORM A CORE LAYER AND AT LEAST ONE ADDITIONAL LAYER

- THE LAYERS MAY EACH INCLUDE A PLURALITY OF TRENCHES ON AT LEAST ONE SURFACE

602

POSITION THE AT LEAST TWO LAYERS IN REGISTRATION

603

IMPRINT SIMULTANEOUSLY A PLURALITY OF CONDUCTOR FEATURES

- E.G., IMPRINT SIMULTANEOUSLY A PLURALITY OF VIAS IN ONE OR MORE OF THE AT LEAST TWO LAYERS

- E.G., IMPRINT SIMULTANTEOUSLY A PLURALITY OF TRENCHES IN ANY LAYER HAVING EXPOSED SURFACE(S)

- THE VIAS AND TRENCHES MAY HAVE DIFFERENT GEOMETRIES, E.G. DEPTHS, WIDTHS, LENGTHS, THICKNESSES, ETC.

| FORM A SUBSTRATE TO MOUNT AN ELECTRONIC COMPONENT |
|---|
| • THE SUBSTRATE INCLUDES A POLYETHER OR A PARTIALLY-CURED MATERIAL SELECTED FROM THE GROUP COMPRISING BISMALEIMIDE RESINS (E.G. BISMALEIMIDE TRIAZENE), EPOXY, POLYCARBONATE, POLYESTER, AND POLYIMIDE<br><br>• E.G. THE MATERIAL MAY INCLUDE POLYETHER HEATED TO A TEMPERATURE IN THE RANGE OF APPROXIMATELY 20 TO 250 DEGREES CELCIUS; OR POLYIMIDE HEATED TO A TEMPERATURE IN THE RANGE OF APPROXIMATELY 20 TO 250 DEGREES CELCIUS; OR AN EPOXY-BASED POLYMER HEATED TO A TEMPERATURE IN THE RANGE OF APPROXIMATELY 20 TO 170 DEGREES CELCIUS |

702

| IMPRINT SIMULTANEOUSLY A PLURALITY OF CONDUCTOR FEATURES IN THE SUBSTRATE |
|---|

703

| CURE SUBSTRATE COMPLETELY (AS NECESSARY) |
|---|
| • E.G. HEAT PARTIALLY-CURED POLYIMIDE MATERIAL TO A TEMPERATURE IN THE RANGE OF APPROXIMATELY 300 TO 400 DEGREES CELCIUS; OR AN EPOXY-BASED POLYMER IN THE RANGE OF APPROXIMATELY 100 TO 200 DEGREES CELCIUS |

FIG. 7

METHODS FOR MANUFACTURING IMPRINTED SUBSTRATES

RELATED APPLICATIONS

The present application is related to the following applications, which are assigned to the same assignee as the present application:

(1) Ser. No. 10/322,902, entitled "Electronic Packages and Components Thereof Formed by Substrate-Imprinting".

(2) Ser. No. 10/335,187, entitled "Methods for Performing Substrate Imprinting using Thermoset Resins".

TECHNICAL FIELD

The subject matter relates generally to electronics packaging. More particularly, the subject matter relates to an electronic package that includes an electronic component packaged on a substrate formed through imprinting, and to manufacturing methods related thereto.

BACKGROUND INFORMATION

Integrated circuits (ICs) have typically been assembled into electronic packages by physically and electrically coupling them to a substrate made of organic or ceramic material. One or more such IC packages can be physically and electrically coupled to a secondary substrate such as a printed circuit board (PCB) or motherboard to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, Web appliance, router, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance while generally being smaller or more compact in size. As market forces drive equipment manufacturers to produce electronic systems with increased performance and decreased size, IC packaging accordingly also needs to support these requirements.

In addition, manufacturers of high-end IC packages, such as processors, are experiencing increasing demand for IC packages mounted in thin, light-weight, and/or resilient packaging, because such packaging is useful for many applications. For example, hand-held electronic systems, such as cellular telephones, palm-top computers, personal digital assistants, calculators, MP3 players, watches, hearing aids, and similar equipment typically requires ICs in thin, light-weight, and/or flexible packages.

An IC substrate may comprise a number of layers. Each layer may include a pattern of metal interconnect lines (referred to herein as "traces") on one or both surfaces. Each layer may also include vias to couple traces or other conductive structure on opposite surfaces of the layer.

An IC substrate typically includes one or more electronic components mounted on one or more surfaces of the substrate. The electronic component or components are functionally connected to other elements of an electronic system through a hierarchy of electrically conductive paths that include the substrate traces and vias. The substrate traces and vias typically carry signals that are transmitted between the electronic components, such as ICs, of the system. Some ICs have a relatively large number of input/output (I/O) terminals (also called "lands" or "pads"), as well as a large number of power and ground terminals.

Surface mount technology (SMT) is a widely known technique for coupling ICs to a substrate. In addition to using SMT to couple an individual IC die to a substrate, it is also well known to use SMT to couple an IC package to a substrate such as a printed circuit board (PCB) or motherboard, using solder bumps, for example.

The formation of conductor features, such as traces and vias, in a substrate typically requires a sequence of complex, time-consuming, and expensive operations that offer ample opportunities for error. For example, forming traces on a single surface of a substrate layer typically requires surface preparation, metallizing, masking, etching, cleaning, and inspecting. Forming vias typically requires drilling, using a laser or mechanical drill. Each process stage requires careful handling and alignment to maintain the geometric integrity of the myriad of traces, vias, and other features. To allow for alignment tolerances, feature sizes and relationships often must be kept relatively large, thus hindering significant reductions in feature density. For example, to provide sufficient tolerance for drilling vias, via pads are typically provided, and these consume significant "real estate".

Fabrication of a typical multi-layer substrate requires that a large number of process operations be performed. In a known example of a multi-layer substrate, a core layer has a plurality of vias (also referred to herein as "plated through holes" or "PTHs") and traces. Traces may be formed on one or both surfaces of the core layer. One or more build-up layers, each with traces on one or more surfaces, and typically with PTHs, are formed. The features of the build-up layers can be formed while these layers are separate from the core layer, and the build-up layers may then be subsequently added to the core layer. Alternatively, some features of the buildup layers may be formed after such layers have been added to the core layer.

For the reasons stated above, and for other reasons stated below which will become apparent to those skilled in the art upon reading and understanding the present specification, there is a significant need in the art for methods and apparatus related to electronics packaging that minimize the complexity, time, and cost of fabricating substrates.

BRIEF DESCRIPTION OF THE DRAWINGS

FIG. 5 is a flow diagram illustrating a method of fabricating an imprinted substrate to mount an electronic component, in accordance with one or more embodiments of the invention;

FIG. 6 is a flow diagram illustrating a method of fabricating an imprinted substrate, comprising at least two layers, to mount an electronic component, in accordance with one or more embodiments of the invention; and FIG. 7 is a flow diagram illustrating a method of fabricating an imprinted substrate, using polyether or a partially-cured material, to mount an electronic component, in accordance with one or more embodiments of the invention.

DETAILED DESCRIPTION OF EMBODIMENTS OF THE INVENTION

In the following detailed description of embodiments of the invention, reference is made to the accompanying drawings that form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that mechanical, chemical, structural, electrical, and procedural changes may be made without departing from the spirit and scope of the present subject matter. The following detailed description is, therefore, not to be taken in a limiting sense, and the scope of embodiments of the present invention is defined only by the appended claims.

Figure 1:
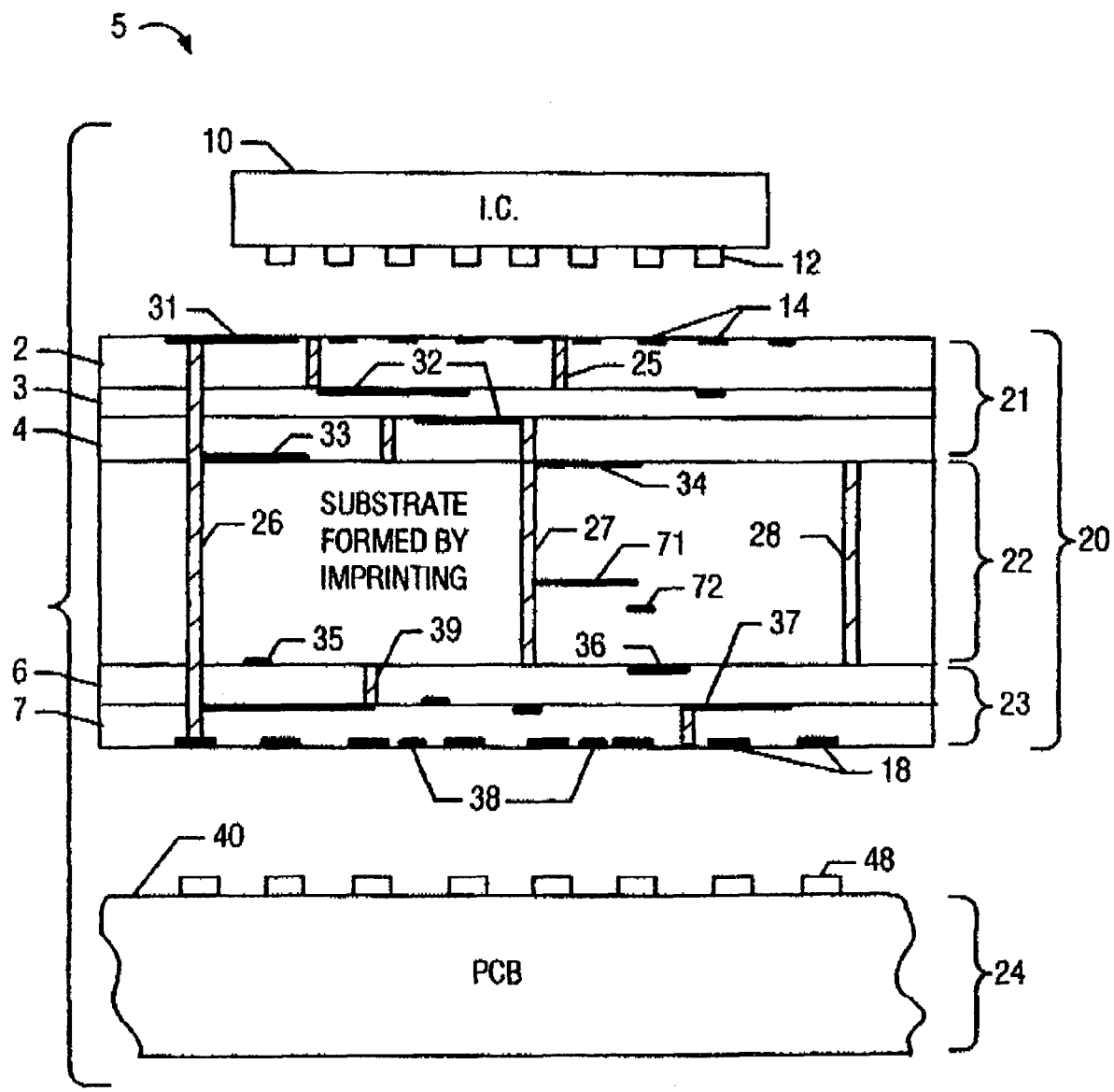
FIG. 1 illustrates a cross-sectional representation of an electronic assembly incorporating a substrate that is formed by imprinting, in accordance with an embodiment of the invention.

FIG. 1 illustrates a cross-sectional representation of an electronic assembly 5 incorporating a substrate 20 that is formed by imprinting, in accordance with an embodiment of the invention.

"Imprint", as used herein, means to form features in a material by forcing a tool against and/or into the material. Imprinting includes stamping, embossing, impressing, extruding, and like processes.

Electronic assembly 5 includes at least one integrated circuit (IC) 10 or other type of active or passive electronic component having a plurality of conductive mounting pads 12. The electronic component may be in either packaged or unpackaged form, as appropriate to the type of substrate 20. The IC 10 (or other type of electronic component) may be of any type, including a microprocessor, a microcontroller, a graphics processor, a digital signal processor (DSP), or any other type of processor or processing circuit. Other types of electronic components that may be included in electronic assembly 5 are a custom circuit, an application-specific integrated circuit (ASIC), or the like, such as, for example, one or more circuits (such as a communications circuit ) for use in wireless devices like cellular telephones, pagers, computers, two-way radios, and similar electronic systems. Electronic assembly 5 may form part of an electronic system (as defined in the Background section above).

IC 10 is physically and electrically coupled to substrate 20. In an exemplary embodiment, IC pads 12 are coupled to corresponding lands 14 on the upper surface of upper build-up section 21 through a suitable attachment mechanism such as solder balls or bumps (not shown).

"Suitable", as used herein, means having characteristics that are sufficient to produce the desired result(s). Suitability for the intended purpose can be determined by one of ordinary skill in the art using only routine experimentation.

Electronic assembly 5 may include an additional substrate, such as a printed circuit board (PCB) 24 (or interposer), below substrate 20. Substrate 20 may be physically and electrically coupled to PCB 24. In an exemplary embodiment, substrate pads 18 are coupled to corresponding lands 48 on the upper surface 40 of PCB 24 through a suitable attachment mechanism such as solder (not shown). PCB 24 can optionally have lands (not shown) on its lower surface for attachment to an additional substrate or other packaging structure in the packaging hierarchy.

In the example shown in FIG. 1, the substrate 20 comprises a core layer 22, an upper build-up section 21 of one or more layers, and a lower build-up section 23 of one or more layers. One of ordinary skill in the art will appreciate that many alternative embodiments are possible, including but not limited to a substrate comprising only a core layer; a substrate comprising a core with two or more upper and/or lower build-up layers; a substrate comprising a core with only upper build-up layer(s); a substrate comprising a core with only lower build-up layer(s); and so forth.

The various constituent layers of substrate 20 can be formed of any suitable material or combination of materials, such as organic or ceramic materials. In various exemplary embodiments, the substrate starting materials may comprise partially-cured organic materials, chemically or thermally softened organic materials, and green ceramic materials. Any other suitable type of material may be used, provided that it can receive an imprint and can retain such for a period of time long enough to permit the imprinted features, such as vias and trenches, to be formed into conductor features, as for example by inserting conductive material into the imprinted features.

"Conductor feature", as used herein, means any type of conducting element associated with a substrate, including vias (e.g. blind vias, through vias, etc.), conductors (e.g. surface traces, internal traces, conductive planes, etc.), mounting terminals (e.g. pads, lands, etc.), and the like.

"Via", as used herein, means any type of conducting element to provide a conductive path between different depths in a substrate. For example, a via can connect conductive elements on opposite surfaces of a substrate, and a via can connect conductive elements at different internal layers within a substrate.

"Trench", as used herein, means any type of conducting element to provide a conductive path at a relatively constant depth in a substrate. "Trench" includes traces, ground planes, and terminals (e.g. pads, lands, etc.). For example, a trace may connect conductive elements on one surface of a substrate. A ground plane may provide a conductive path at a relatively constant depth within a substrate. Terminals may provide conductive paths on one surface of a substrate.

Core layer 22, in the example shown in FIG. 1, comprises conductor features in the form of vias 26-28. Core layer 22 also comprises conductor features in the form of one or more trenches 34 in its upper surface, one or more trenches 35 in its lower surface, and one or more internal trenches (e.g. traces 71 and 72). Some or all of the conductor features may be formed through an imprinting process, as will be explained in greater detail below.

Core layer 22 may be formed in various ways. For example, core layer 22 may be formed as a single layer of material. Alternatively, core layer 22 may comprise multiple layers of material. In the example shown in FIG. 1, core layer 22 comprises multiple layers, and internal traces 71 and 72 are formed in the vicinity of the boundaries between individual layers. The boundaries between the multiple layers making up core layer 22 are not shown in FIG. 1. Internal traces 71 and 72 may be formed in any suitable manner, including a manner that is similar to or identical to that used to form trenches in upper build-up section 21 and lower build-up section 23, as will be explained in greater detail below.

Upper build-up section 21, in the example shown in FIG. 1, comprises three build-up layers 2-4. Upper build-up section 21 further comprises conductor features in the form of one or more vias 25 and 26, one or more trenches (e.g. trace 31 and lands 14) in the upper surface of layer 2, and one or more trenches 33 in the lower surface of layer 4. Upper build-up section 21 may further comprise internal trenches 32, which may be formed in the internal upper and/or lower surfaces of layers 2-4, such as in the lower surface of layer 2, the upper or lower surfaces of layer 3, and/or in the upper surface of layer 4.

Lower build-up section 23, in the example shown in FIG. 1, comprises two build-up layers 6-7. Lower build-up section 23 further comprises conductor features in the form of one or more vias 26 and 39, one or more trenches 36 in the upper surface of layer 6, and one or more trenches (e.g. traces 38 and pads 18) in the lower surface of layer 7. Lower build-up section 23 may further comprise one or more internal trenches 37, which may be formed in the internal upper and/or lower surfaces of layers 6-7, such as in the lower surface of layer 6, and/or in the upper surface of layer 7.

Figure 2:
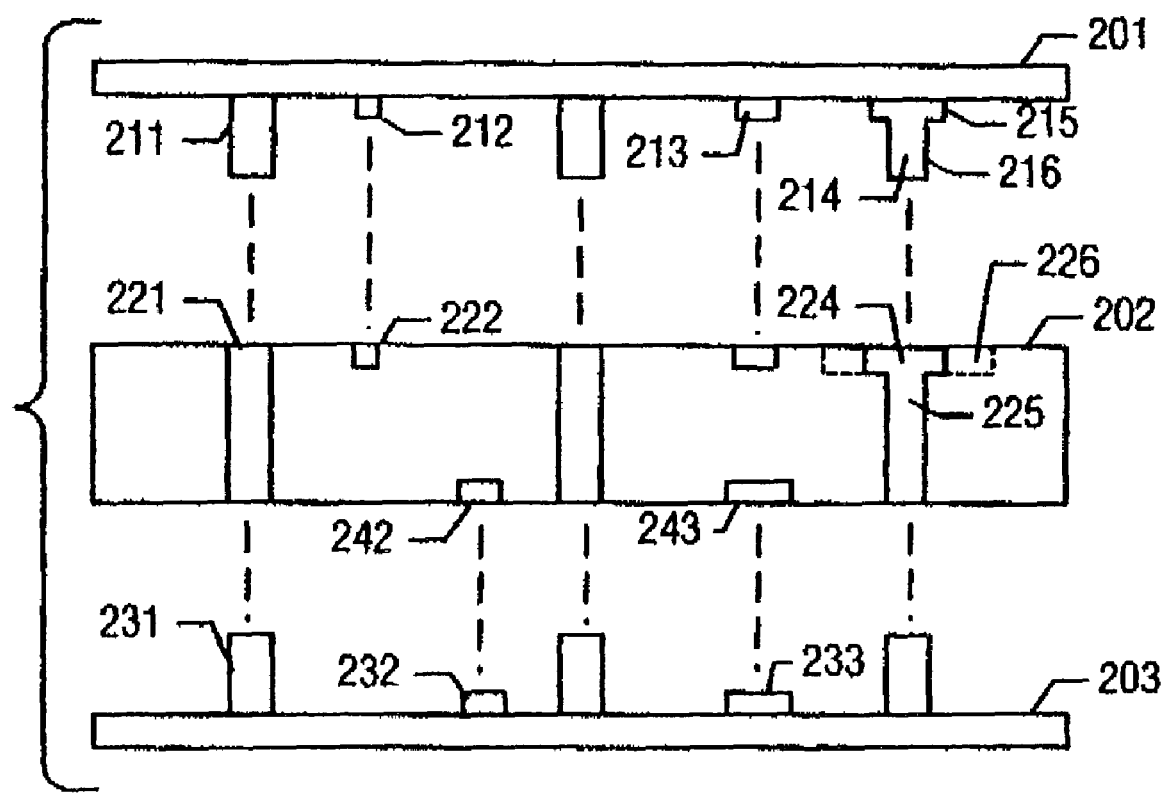
FIG. 2 illustrates a cross-sectional representation of a substrate formed by imprinting, and corresponding upper and lower imprinting elements, in accordance with an embodiment of the invention.

FIG. 2 illustrates a cross-sectional representation of a substrate 202 formed by imprinting, and corresponding upper and lower imprinting elements 201 and 203, in accordance with an embodiment of the invention. Substrate 202, as shown in FIG. 2, can be a self-contained substrate, or it can form part of a multi-layer substrate.

Substrate 202 comprises one or more vias, such as vias 221 and 225. Substrate 202 further comprises one or more trenches, such as trenches 222, 224, 242, and 243. Trenches 222 and 224 (e.g. traces or lands) are in the upper surface of substrate 202, while other trenches, such as trenches 242-243, are in the lower surface of substrate 202.

Via 225 is formed within trench 224. In accordance with the present subject matter, vias, such as via 225, need not be formed within via pads. Via pad 226, shown in dashed outline, depicts a prior art structure (unnecessary in embodiments of the present invention) that is used to assure that vias are drilled within a region of the substrate so that they ultimately make electrical contact with a trace to which the via pad is connected. Via pads, as used in prior art substrate structures, thus provide a fairly wide tolerance with respect to the location of corresponding via holes. A disadvantage of using via pads is the significant amount of real estate they consume on the substrate surface.

In the imprinted substrate 202 depicted in FIG. 2, the trench 224 and the via 225 are formed simultaneously, so there is no need to provide a via pad to assist in registering via 225 with trench 224. By eliminating the need for via pads, the imprinted substrate 202 can accommodate a higher density of conductor features, such as vias, traces, and mounting terminals.

Also shown in FIG. 2 are an upper imprinting element 201 and a lower imprinting element 203. Upper and lower imprinting elements 201 and 203 may be considered imprinting tools.

Upper imprinting element 201 comprises a plurality of protrusions or dies, such as dies 211-214. Dies 211-214 may be of different geometries. For example, dies 211-214 may have different widths and depths. Dies 211 and 214 have greater depths than dies 212 and 213. Dies 211 and 213 have greater widths than die 212.

Die 214 provides a combination of at least two different geometries. Die 214 includes a relatively wide region 215 at its base, corresponding to trench 224 in the upper surface of substrate 202. Die 214 further includes a narrower region 216, corresponding to via 225 in substrate 202.

Lower imprinting element 203 also comprises a plurality of protrusions or dies, such as dies 231-233. Dies 231-233 may be of different geometries. For example, dies 231-233 may have different widths and depths. Die 231 has a greater depth than die 232. Die 233, to form mounting pad 243, has a greater width than dies 231 and 232.

Figure 3:
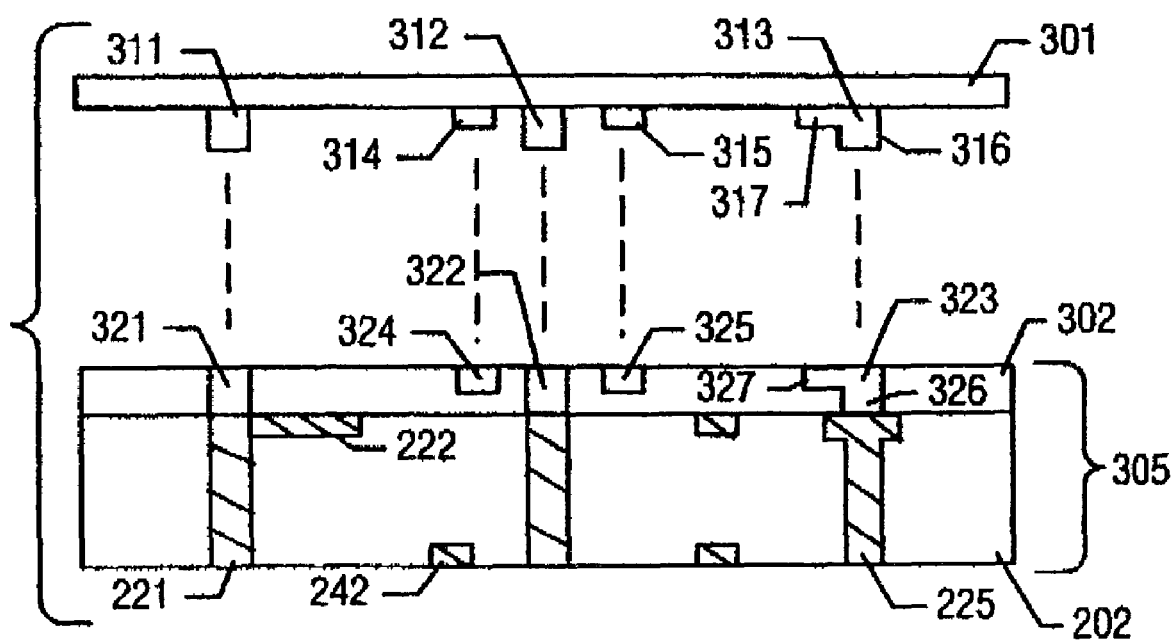
FIG. 3 illustrates a cross-sectional representation of a substrate formed by imprinting, and a corresponding imprinting element having relatively short imprinting dies, in accordance with an embodiment of the invention.

FIG. 3 illustrates a cross-sectional representation of a substrate 305 formed by imprinting, and a corresponding imprinting element 301 having relatively short imprinting dies 311-315, in accordance with an embodiment of the invention. Substrate 305, as shown in FIG. 3, can be a self-contained substrate, or it form part of a multi-layer substrate.

Substrate 305 comprises an upper layer 302 and a lower layer 202. In an exemplary embodiment wherein additional build-up layers (not shown) are added below layer 202, layer 202 could be described as a core layer. For example, in an exemplary embodiment, a number of build-up layers could lie both above and below layer 202. Layer 202 may include internal traces (not shown) situated between multiple layers (not shown). Such internal traces could be formed in any suitable manner, including a manner that is similar to or identical to that used to form trenches 324-325 in upper layer 302, as will be explained in greater detail below.

In the example shown in FIG. 3, layer 202 has been previously imprinted in an imprinting operation. After the imprinting operation, a suitable conductive material such as copper was inserted into the conductor features of layer 202. Thus, vias 221 and 225, and trenches 222 and 242, contain conductive material, as represented by cross-hatching.

After having conductive material applied to it, layer 202 was registered with and coupled to layer 302 to form substrate 305.

Layer 302 comprises a plurality of conductor features that have been formed therein. The conductor features may include vias such as vias 321-323 and trenches such as trenches 324-325.

Also shown in FIG. 3 is an imprinting element 301. Imprinting element 301 includes a plurality of dies 311-315. In the example shown in FIG. 3, the depths of dies 311-313, used to form corresponding vias 321-323 in layer 302, are relatively short, and they do not extend beyond the lower surface of layer 302 when imprinting element 301 is pressed against layer 302.

Die 313 is shaped to form a via at or very near the edge of a trench. Die 313 comprises a portion 316 to form via 326. Die 313 further comprises a portion 317 to form trench 327.

Figure 4:
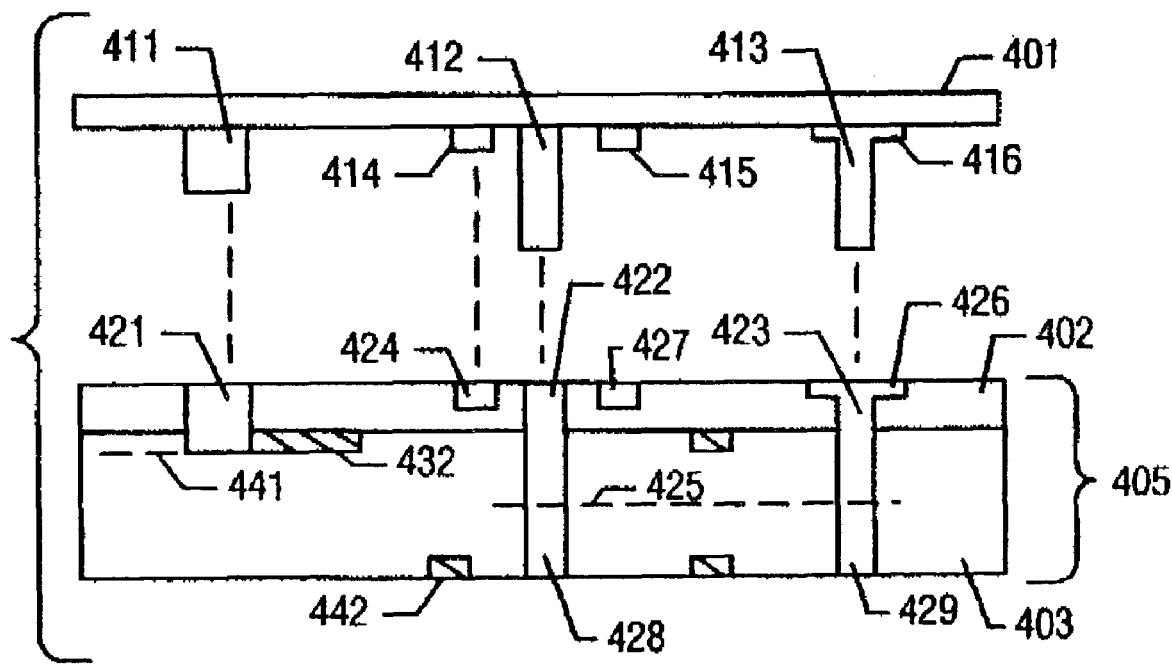
FIG. 4 illustrates a cross-sectional representation of a substrate formed by imprinting, and a corresponding imprinting element having relatively long imprinting dies, in accordance with an embodiment of the invention.

FIG. 4 illustrates a cross-sectional representation of a substrate 405 formed by imprinting, and a corresponding imprinting element 401 having relatively long imprinting dies 412-413, in accordance with an embodiment of the invention. Substrate 405, as shown in FIG. 4, can be a self-contained substrate, or it form part of a multi-layer substrate.

Substrate 405 comprises an upper layer 402 and a lower layer 403. In an exemplary embodiment wherein additional build-up layers (not shown) are added below layer 403, layer 403 could be described as a core layer. For example, in an exemplary embodiment, a number of build-up layers could lie both above and below layer 403. Layer 402 may include internal traces (not shown) situated between multiple layers (not shown). Such internal traces could be formed in any suitable manner, including a manner that is similar to or identical to that used to form trenches 424 and 427 in upper layer 402.

In the example shown in FIG. 4, lower layer 403 has been previously imprinted in an imprinting operation. After the imprinting operation, a suitable conductive material such as copper was inserted into the conductor features of layer 403.

Thus, trenches 432 and 442, contain conductive material, as represented by cross-hatching.

After having conductive material applied to it, lower layer 403 was registered with and coupled to upper layer 402. Lower layer 403, which had certain conductor features (e.g. trenches 432 and 442) imprinted in a first imprinting operation (using a different imprinting element than imprinting element 401), may have other conductor features (e.g. vias 421, 422, and 423) imprinted in a second imprinting operation (using imprinting element 401).

Also shown in FIG. 4 is an imprinting element 401. Imprinting element 401 includes a plurality of dies 411-415. In this example, the depths of dies 412-413 that are used to form corresponding vias 422-423 in layer 402, are relatively long, and they extend beyond the lower surface of layer 402 when imprinting element 401 is pressed against layer 402. Dies 412 and 413 may extend as far into layer 403 as dashed line 425.

In the example shown in FIG. 4, upper layer 402 has not been previously imprinted in an imprinting operation. Upper layer 402, in registration with lower layer 403, is imprinted simultaneously with lower layer 403. In such an imprinting operation, various conductor features are formed in upper layer 402. The conductor features may include via 421 (which also extends partly into lower layer 403), vias 422-423, and trenches such as trenches 424 and 427.

As mentioned above, dies 412-413 are used to form vias 422-423. Vias 422-423 pass entirely through upper layer 402 and at least partly into lower layer 403, down to dashed line 425. In the embodiment shown in FIG. 4, the lower portions 428-429 of vias 422-423 within lower layer 403 are formed by corresponding dies of a lower imprinting element (not shown). Alternatively, the lower portions 428-429 of vias 422-423 could be formed by the use of a different imprinting element 401 having longer dies 412-413.

Die 411 of imprinting element 401 is relatively short. Die 411 extends entirely through upper layer 402, forming via 421 therein, and die 411 further extends only to dashed line 441 within lower layer 403.

Dies 414 and 415 of imprinting element 401 are also relatively short, and they are used to form corresponding trenches 424 and 427 in the upper surface of upper layer 402.

Die 413 is shaped to form a via within a trench. Die 413 comprises a relatively long portion 413 to form via 423. Die 413 further comprises a portion 416 to form a corresponding trench 426.

In addition to the examples shown, many other types of substrates can be formed, including printed circuit board (PCB) substrates having one or more layers.

FIG. 5 is a flow diagram illustrating a method of fabricating an imprinted substrate to mount an electronic component, in accordance with one or more embodiments of the invention.

In 501, a substrate is formed upon which to mount an electronic component of any type. The substrate may comprise one or more layers. The substrate may be formed of insulating material selected from the group comprising bismaleimide resin such as bismaleimide triazene (known in the art as "BT"), driclad, epoxy, liquid crystal polymer, polycarbonate, polyester, polyether, and polyimide. Optionally, the substrate material may be formed of a polymer, such as polyimide or epoxy, to which particles have been added. For example, the particles may comprise silica, alumina, or fiberglass.

In 502, a plurality of conductor features are simultaneously imprinted in the substrate. The conductor features may be imprinted in one or both surfaces of the substrate. The conductor features may include one or more vias and/or trenches.

The conductor features may optionally have different geometries. For example, the conductor features may have different depths, widths, lengths, thicknesses, and the like. Vias may be formed within trenches, e.g. centered within a trench or along the side of a trench. Vias need not be formed within via pads. All conductor features can be formed simultaneously within one or multiple layers.

In 503, an electrically conductive material is inserted into the conductor features. The metallization operation may be performed using a suitable technique such as sputtering, plating, etc. A suitable operation to planarize the substrate may be used subsequent to metallization.

FIG. 6 is a flow diagram illustrating a method of fabricating an imprinted substrate, comprising at least two layers, to mount an electronic component, in accordance with one or more embodiments of the invention.

In 601, a substrate is formed upon which to mount an electronic component of any type. In an exemplary embodiment, the substrate may comprise two or more layers, each including a plurality of conductor features in a conductor region.

"Conductor region", as used herein, means an imaginary projection of a region on the substrate, inside of which region all conductor features (as defined earlier) are contained. A "conductor region" is typically substantially square or rectangular, although it need not be limited to such shapes.

In an exemplary embodiment, the substrate may comprise a core layer and at least one additional layer. The layers may each include a plurality of trenches on at least one of their surfaces. For example, the core layer could comprise a plurality of trenches on one or both surfaces (and/or internally), as could the at least one additional layer. (Trenches in the form of terminals are usually positioned on outer surfaces of the layers.)

In 602, the at least two layers are positioned in registration with respect to each other. Registration can be accomplished via any suitable mechanism and/or process.

In 603, a plurality of conductor features are imprinted simultaneously in the combination of at least two layers. For example, a plurality of vias may be simultaneously imprinted in one or more of the at least two layers. A plurality of trenches may also be imprinted simultaneously in any layer having one or more exposed surfaces. The vias and trenches may have different geometries. For example, the vias and trenches may have different depths, widths, lengths, thicknesses, and the like.

While not explicitly shown in FIG. 6, other fabrication operations, such as inserting electrically conductive material into some or all of the conductor features, may be carried out at suitable points in the fabrication process, in a manner similar or identical to that described above regarding 503 of FIG. 5.

FIG. 7 is a flow diagram illustrating a method of fabricating an imprinted substrate, using polyether or a partially-cured material, to mount an electronic component, in accordance with one or more embodiments of the invention.

In 701, a substrate is formed upon which to mount an electronic component of any type. The substrate includes a polyether or a partially-cured material selected from the group comprising bismaleimide resin such as bismaleimide triazene ("BT"), driclad, epoxy, polycarbonate, polyester, and polyimide.

As one example, polyether material may be heated to a temperature in the range of approximately 20 to 250 degrees Celsius. As another example, a partially-cured material may include polyimide heated to a temperature in the range of approximately room temperature (e.g., 20 degrees Celsius) to approximately 250 degrees C. As yet another example, a partially-cured material may include an epoxy-based polymer heated to a temperature in the range of approximately room temperature to approximately 170 degrees C. Heating may be provided by any suitable apparatus, such as infrared or microwave radiation, heating coils, etc.

In 702, while maintaining the temperature of the substrate material at the previously described temperature, a plurality of conductor features are simultaneously imprinted in the substrate material. The conductor features may be of the type previously described. The conductor features may also have different geometries, as previously described.

In 703, if necessary, the substrate is subsequently cured completely through a suitable process. For example, in the above-mentioned example of polyimide, it may be cured by heating it within the range of approximately 300 to 400 degrees C. In the above-mentioned example of an epoxy-based polymer, it may be cured by heating it within the range of approximately 100 to 200 degrees C. It will be understood by those of ordinary skill in the art that the cure times for such substrate materials may be inversely proportional to the cure temperatures. As one example, a substrate formed from a particular epoxy-based polymer may be cured at 170 C for 30 minutes or at 120 C for 90 minutes.

A suitable cleaning operation may be performed on the substrate material, if and when required, for example prior to a curing operation, and/or prior to a metallization operation.

Eventually the imprintable tape is separated or "singulated" into individual segments. After singulation, the individual tape substrate segments may be transported throughout the fabrication environment through any suitable apparatus, such as transport carriers or trays, for subsequent fabrication operations, such as combining them with one or more other substrate layers, inspecting them, and possibly other manufacturing operations.

Other types of suitable imprintable material may be used.

The operations described above with respect to the methods illustrated in FIGS. 5-7 can be performed in a different order from those described herein.

Embodiments of the present invention provide for electronic substrates that can be fabricated with relatively less complexity, time, and cost, and with relatively greater density compared with known electronic substrates.

An electronic system that incorporates one or more electronic assemblies that utilize the present subject matter can be produced in configurations having reduced cost and enhanced reliability relative to known structures and fabrication methods, and such systems are therefore more commercially attractive.

As shown herein, the present subject matter can be implemented in a number of different embodiments, including an electronic package substrate, an electronic package, and various methods of fabricating a substrate. Other embodiments will be readily apparent to those of ordinary skill in the art. The elements, materials, geometries, dimensions, and sequence of operations can all be varied to suit particular packaging requirements.

FIGS. 1 through 4 are merely representational and are not drawn to scale. Certain proportions thereof may be exaggerated, while others may be minimized. FIGS. 1-7 are intended to illustrate various implementations of the subject matter that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present subject matter. Therefore, it is manifestly intended that embodiments of this invention be limited only by the claims and the equivalents thereof.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

What is claimed is:

1. A method comprising:

forming a substrate to mount an electronic component, the substrate comprising a core layer and at least one additional insulating layer, wherein the substrate comprises a plurality of conductive lands on a first surface to mount the electronic component, and wherein the substrate comprises a plurality of conductive pads on a second surface;

imprinting a plurality of conductor features simultaneously in the substrate, wherein the conductor features comprise a plurality of through vias to provide a plurality of conductive paths between and through the core layer and the at least one additional insulating layer, wherein the conductor features further comprise a plurality of trenches, wherein at least one of the through vias is formed within at least one trench, and wherein at least one of the through vias goes entirely through the core layer and the at least one additional insulating layer and connects one of the conductive lands to one of the conductive pads;

wherein imprinting comprises imprinting simultaneously the plurality of trenches in the at least one additional insulating layer and the plurality of through vias in both the core layer and in the at least one additional insulating layer;

wherein the through vias include a first through via having an upper portion formed by imprinting the upper portion from a first side of the substrate with a first imprinting tool of circular cross-section extending into the substrate to a depth;

wherein the first through via further comprises a lower portion formed by imprinting the lower portion from a second side of the substrate with a second imprinting tool of circular cross-section extending into the substrate to meet the first die at the depth; and wherein the depth is midway between the first and second sides; and filling the imprinted conductor features with an electrically conductive material.

2. The method recited in claim 1 wherein, in imprinting, the plurality of through vias have different geometries.

3. The method recited in claim 2, wherein the through vias have different widths.

4. The method recited in claim 1 wherein, in imprinting, the conductor features comprise at least two vias, including a first via being of a different width than a second via.

5. The method recited in claim 1 wherein, in imprinting, the conductor features comprise at least two vias, including a first via being of a different depth than a second via.

6. The method recited in claim 1 wherein, in imprinting, the conductor features comprise at least one via not formed within a via pad.

7. The method recited in claim 1 wherein, in forming, the substrate is formed of material selected from the group consisting of bismaleimide, driclad, epoxy, liquid crystal polymer, polycarbonate, polyester, polyether, and polyimide.

8. The method recited in claim 1, wherein forming comprises forming at least two layers in the substrate, each comprising a plurality of trenches in a conductor region.

9. The method recited in claim 1 wherein, in imprinting, a selected number of the trenches have different depths.

10. The method recited in claim 1 wherein, in imprinting, a selected number of the trenches have different widths.

11. The method recited in claim 1 wherein, in imprinting, a selected number of the vias have different depths.

12. The method recited in claim 1 wherein, in imprinting, a selected number of the vias have different widths.

13. The method recited in claim 1, wherein forming comprises forming the core layer and at least two additional insulating layers.

14. The method recited in claim 13, wherein imprinting comprises imprinting simultaneously the plurality of trenches in the at least two additional insulating layers and the plurality of vias in both the core layer and in the at least two additional insulating layers.

15. A method comprising:
    forming a multi-layer substrate to mount an electronic component, wherein forming comprises
        forming a core layer, wherein a plurality of conductor features are imprinted in the core layer;
        forming an upper build-up section of two or more additional insulating layers, wherein a plurality of conductor features are imprinted in the upper build-up section;
        forming a lower build-up section of two or more additional insulating layers, wherein a plurality of conductor features are imprinted in the lower build-up section; and
        combining the core layer, upper build-up section, and lower build-up section into the multi-layer substrate; and
    imprinting a plurality of conductor features simultaneously in the multi-layer substrate, wherein imprinting comprises imprinting a plurality of trenches in the upper build-up section and the lower build-up section and imprinting a plurality of vias in the multi-layer substrate, wherein the vias are to provide a plurality of conductive paths between the core layer and at least one of the build-up sections, wherein the vias have different depths, and wherein at least one via goes entirely through the core layer and the build-up sections, and wherein all the conductor features are filled with an electrically conductive material.

16. The method recited in claim 15 wherein, in imprinting, the conductor features comprise at least one via formed within at least one trench.

17. The method recited in claim 15 wherein, in imprinting, the conductor features comprise a plurality of vias having different geometries.

18. The method recited in claim 15, wherein the vias have different widths.

19. The method recited in claim 15 wherein, in imprinting, the conductor features comprise at least one via not formed within a via pad.

20. The method recited in claim 15, wherein the plurality of conductor features in the upper build-up section comprise at least one trench, and wherein at least one through via is formed within the at least one trench.

21. The method recited in claim 15, wherein a plurality of conductor features are imprinted in each layer of the upper build-up section.

* * * * *

UNITED STATES PATENT AND TRADEMARK OFFICE
CERTIFICATE OF CORRECTION

PATENT NO. : 7,637,008 B2  Page 1 of 1
APPLICATION NO. : 10/323165
DATED : December 29, 2009
INVENTOR(S) : Dory et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 799 days.

Signed and Sealed this

Twenty-first Day of December, 2010

David J. Kappos
*Director of the United States Patent and Trademark Office*